United States Patent [19]

Ochiai et al.

[11] Patent Number: 5,529,885
[45] Date of Patent: Jun. 25, 1996

[54] NEGATIVE PHOTOSENSITIVE COMPOSITION AND METHOD FOR FORMING PATTERNS USING THE COMPOSITION

[75] Inventors: Tameichi Ochiai, Sagamihara; Ryuichiro Takasaki; Yasuhiro Kameyama, both of Machida; Shichiro Takahashi, Yokohama, all of Japan

[73] Assignee: Mitsubishi Chemical Corporation, Tokyo, Japan

[21] Appl. No.: 253,776

[22] Filed: Jun. 3, 1994

[30] Foreign Application Priority Data

Jun. 4, 1993 [JP] Japan .................... 5-134876
Jun. 22, 1993 [JP] Japan .................... 5-150497

[51] Int. Cl.$^6$ .................... G03C 1/73; G03F 7/038; G03F 7/38
[52] U.S. Cl. .................... 430/270.1; 430/325; 430/330; 430/927; 522/63; 522/126; 522/134
[58] Field of Search .................... 430/270, 325, 430/927, 330, 270.1; 522/126, 134, 63

[56] References Cited

U.S. PATENT DOCUMENTS

| | | |
|---|---|---|
| 3,954,475 | 5/1976 | Bonham et al. . |
| 3,987,037 | 10/1976 | Bonham et al. . |
| 4,160,671 | 7/1979 | Stahlhofen . |
| 5,034,304 | 7/1991 | Feely . |
| 5,180,653 | 1/1993 | Miyabe et al. .......... 430/296 |
| 5,204,225 | 4/1993 | Feely . |
| 5,286,600 | 2/1994 | Ochiai . |
| 5,292,614 | 3/1994 | Ochiai et al. .......... 430/270 |
| 5,368,783 | 11/1994 | Kobayashi et al. .......... 430/325 |

FOREIGN PATENT DOCUMENTS

| | | | |
|---|---|---|---|
| 0483693 | 5/1992 | European Pat. Off. .......... 430/270 |
| 63-261352 | 10/1988 | Japan . |
| 3-75652 | 3/1991 | Japan . |
| 5-45879 | 2/1993 | Japan . |
| 5-313370 | 11/1993 | Japan . |

Primary Examiner—Janis L. Dote
Attorney, Agent, or Firm—Oblon, Spivak, McClelland, Maier & Neustadt

[57] ABSTRACT

Disclosed are a negative photosensitive composition comprising an alkali-soluble resin, a photo acid generating system, and a crosslinking agent for the alkali-soluble resin which acts on the resin under acidic conditions, in which the crosslinking agent is a highly-alkylated alkoxymethylmelamine resin having a monomer content of from 5 to 40% by weight, and a method for forming a negative photo-resist pattern using the composition. The resist composition is stable during storage and gives good pattern profiles having high aspect ratios even though the resist film is made thick.

21 Claims, No Drawings

NEGATIVE PHOTOSENSITIVE COMPOSITION AND METHOD FOR FORMING PATTERNS USING THE COMPOSITION

FIELD OF THE INVENTION

The present invention relates to a negative photosensitive composition which is generally sensitive to radiations and to a method for forming patterns using the composition. More precisely, it relates to a negative photo-resist to be used for forming semiconductor integrated circuits and to a method for forming negative photo-resist patterns.

BACKGROUND OF THE INVENTION

There has been a steady increase in the degree of integration in semiconductor integrated circuits in these days, and the speed of the increase is such that the degree of integration in them is increased four times in three years, as has been so said generally in this technical filed. Referring to a dynamic random access memory device as one example, those having a storage capacity of 4 M bits have been and are being produced in industrial full-scale plants in these days.

The requirements for photo-lithographic techniques which are indispensable to the production of integrated circuits are becoming severer year by year. For instance, it is said that the production of 4 M-bit DRAM needs a 0.8 µm-level lithographic technique, and it is presumed that 16 M-bit or 64 M-bit DRAM having a higher degree of integration will need a 0.5 µm-level or 0.3 µm-level lithographic technique, respectively. Therefore, the development of resists which are acceptable in half-micron lithography is really desired.

Given the situations, exposure systems for the techniques have been and are being improved. For instance, the conventional reduction-projecting exposure method is combined with a system of a so-called phase-shift method where the phase of light is reversed, whereby the contrast of optical images to be formed may be increased extremely. According to the phase-shift method, however, positive resists form unnecessary patterns in the boundary where the phase is reversed. Therefore, high-resolution negative resists that do not form such unnecessary patterns are strongly desired.

On the other hand, as negative resists to be used in photo-lithography, well known are resists composed of a cyclized-rubber and a crosslinking agent of a bis-azide. However, the system of these resists needs organic solvents for development, by which it is swollen during development. Therefore, the resolution of images is limited to about 3 µm level when the resists are used. For these reasons, the resists are unsuitable for producing integrated circuit devices having a high degree of integration. In addition, organic solvents to be used for development have various problems as they often cause environmental pollution, they are often harmful to human bodies and they are often inflammable.

Also well known are positive resists composed of a naphthoquinone diazide and an alkali-soluble novolak resin. However, since these are positive resists, it is difficult to apply them to the phase-shift method advantageous for half-micron lithography. In addition, as having a large absorption at 300 nm or less, these have another drawback that the pattern profiles to be formed using them are extremely bad when short-wavelength exposure is applied to them.

As examples that will be acceptable as high-resolution lithography, mentioned are X-ray lithography and electron beam lithography. However, the former is not satisfactory with respect to the hardwares and the resists to be used for it, while the latter cannot be utilized in industrial mass-production in view of its throughput.

Recently, a chemical amplified negative resist composed of an acid-curable resin system containing a photo acid generating agent capable of generating an acid by UV exposure (for example, refer to Japanese Patent Application Laid-Open No. 62-164045). Since the resist of this type utilizes chemical amplification, it has a high sensitivity and a high resolving power, but the stability thereof during storage is not sufficient so that it has such a problem that its sensitivity is extremely lowered when a photosensitive resist liquid containing it is stored at room temperature. Therefore, in order to use the chemical amplified resist composition for industrial mass-production of 16 M-bit and 64 M-bit semiconductor devices, it is necessary to improve the stability of the resist. In this connection, Japanese Patent Application Laid-Open No. 3-75652 mentions that the sensitivity and the stability of the resist may be improved by adding thereto a melamine resin containing hexamethoxymethylmelamine monomer in a content of 83 % by weight or more. However, the purification of hexamethoxymethylmelamine to a high degree needs distillation of the crude compound in high vacuum and high temperatures. Therefore, it is difficult to produce the intended melamine resin and the disclosed technique is not industrially practicable.

On the other hand, Japanese Patent Application Laid-Open No. 5-45879 mentions that "methylated methylolmelamine monomers are most popularly used as crosslinking agents at present, but the resolving power of the resist composition containing the monomer as the crosslinking agent is insufficient". This rather mentions that a negative resist having a high resolving power may be obtained when an oligomer of methylated methylolmelamines of a formula:

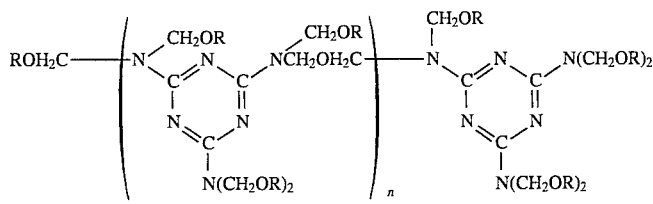

wherein R represents an alkyl having from 1 to 10 carbon atoms, and n is an integer of from 1 to 20, is used as the crosslinking agent. However, in order to obtain the oligomer, partitioning operation by high performance liquid chromatography is necessary. Therefore, the use of the oligomer is not industrially practicable. In addition, when the oligomer is used as the crosslinking agent, the resist pattern profiles to be formed are often unfavorable, depending on the wavelength range of the light to be used for exposure.

With the improvement in the degree of integration of LSI, a large number of lithographic steps have become needed and patterning of resists in the area of the support having great difference in level has become needed. Specifically, resists capable of forming fine patterns having high aspect ratios (height of resist pattern/width of resist pattern) even though the resist film is made thick are strongly desired. Since such resists that may give good patterns even though being coated thick may be used even in ion-injecting steps and in etching steps where the selected ratio of the substrate to the resist cannot be large, they are preferred as they may be used in broad situations.

As mentioned herein above, chemical amplified negative resists comprising an acid-curable resin system and a photo acid generating agent capable of generating an acid by UV exposure have a high sensitivity and a high resolving power. However, conventional chemical amplified negative resists had such a problem, even though they might form patterns at a practical sensitivity, that the pattern profiles formed became extremely bad when the resists were coated thick so that resist patterns having high aspect ratios could not be obtained.

As mentioned herein above, resists that do not swell during development and that may be applied to phase-shift methods are indispensable for half-micron lithography. However, conventional cyclo-rubber type resists and naphthoquinone diazide-novolak type resists both do not meet the two requirements. On the other hand, conventional chemical amplified negative resists meet the indispensable requirements for half-micron lithography, but they have a serious problem with respect to the stability thereof during storage. In addition, they also have other problems with respect to the pattern profiles themselves to be formed and the aspect ratios of the formed pattern profiles, especially when the thickness of the film of the resist is made large.

SUMMARY OF THE INVENTION

One object of the present invention is to provide a high-sensitivity negative resist which has overcome the problem of the instability of conventional chemical amplified negative resists during storage, which is sensitive to UV-range lights and which may form good pattern profiles.

Another object of the present invention is to provide a high-sensitivity negative resist which is free from the above-mentioned problems in the prior art, which may be subjected to half-micron lithography using UV-range lights and which may form good pattern profiles having high aspect ratios even though the resist film is made thick.

Still another object of the present invention is to provide a high-sensitivity negative resist which is especially suitable for a method of forming resist patterns using lights having a wavelength of 450 nm or smaller.

Still another object of the present invention is to provide a method for forming resist patterns having good pattern profiles and having high aspect ratios.

In order to attain the above-mentioned objects, we, the present inventors assiduously investigated and studied and, as a result, have found that the stability of a resist composition comprising an alkali-soluble resin, a crosslinking agent and a photo acid generating system during storage may be noticeably improved when a highly-alkylated alkoxymethylmelamine resin having a monomer content of from 5 to 40 % by weight is used as the crosslinking agent and that the resist composition is a high-quality negative photo-resist composition which is non-swellable and which may form high-resolution pattern profiles.

In addition, we also have found that the resist composition containing, as the photo acid generating system, such one that is sensitive to i-line of a mercury lamp (which will be abbreviated as i-line hereafter) is a high-quality negative photo-resist composition capable of forming resist patterns having good pattern profiles and having high aspect ratios.

Accordingly, one subject matter of the present invention resides in a negative photosensitive composition comprising an alkali-soluble resin, a photo acid generating system, and a crosslinking agent for the alkali-soluble resin which acts on the resin under acidic conditions, in which the crosslinking agent is a highly-alkylated alkoxymethylmelamine resin having a monomer content of from 5 to 40 % by weight.

Another subject matter of the present invention resides in a method for forming a negative photo-resist pattern comprising a step of coating a negative photosensitive composition comprising an alkali-soluble resin, a photo acid generating system, and a crosslinking agent for the alkali-soluble resin which acts on the resin under acidic conditions, in which the crosslinking agent is a highly-alkylated alkoxymethylmelamine resin having a monomer content of from 5 to 40 % by weight, on a semiconductor substrate, a step of transferring a pattern by exposing the coated photosensitive composition, a step of heating the pattern-transferred photosensitive composition, and a step of developing the pattern.

DETAILED DESCRIPTION OF THE INVENTION

Now, the present invention will be described in detail with reference to the preferred embodiments.

The alkali-soluble resin for use in the present invention is not specifically defined, provided that the non-exposed part of the resin is soluble in alkalies during development so that it dissolves in an alkaline developer. In general, used are novolak resins, polyvinyl phenols, polyacrylic acids, polyvinyl alcohols, styrenemaleic anhydride resins, as well as polymers containing monomers of acrylic acids, vinyl alcohols or vinyl phenols, and their derivatives. Of these, especially preferred are novolak resins and polyvinyl phenols.

The novolak resins include, for example, those obtained by polycondensation of at least one aromatic hydrocarbon selected from among m-cresol, o-cresol, p-cresol, 2,5-xylenol, 3,5-xylenol, resorcinol, pyrogallol, bisphenol, bisphenol A, trisphenol, o-ethylphenol, m-ethylphenol, p-ethylphenol, propylphenol, n-butylphenol, t-butylphenol, 1-naphthol, 2-naphthol, etc. and at least one aldehyde or ketone selected from among aldehydes such as formaldehyde, acetaldehyde, propionaldehyde, benzaldehyde, furfural, etc. and ketones such as acetone, methyl ethyl ketone, methyl isobutyl ketone, etc., in the presence of an acidic catalyst. In place of formaldehyde and acetaldehyde, usable are paraformaldehyde and paraldehyde, respectively. The novolak resins to be used in the present invention have a weight average molecular weight measured by gel permeation chromatography (hereinafter referred to as GPC) in terms of polystyrene (hereinafter referred to as Mw) of from 1,000 to 15,000, preferably from 1,500 to 10,000.

As the novolak resins for use in the present invention, more preferred are those obtained by polycondensation of at least one phenol selected from the group consisting of o-cresol, m-cresol, p-cresol, 2,5-xylenol, 3,5-xylenol and resorcinol, and at least one aldehyde selected from the group consisting of formaldehyde, acetaldehyde and propionaldehyde.

Of these novolak resins, especially preferred are those obtained by polycondensation of a phenol or phenol mixture composed of m-cresol/p-cresol/2,5-xylenol/3,5-xylenol/resorcinol at a molar ratio of (70 to 100)/(0 to 30)/(0 to 20)/(0 to 20)/(0 to 20) and aldehyde(s). As the aldehyde, especially preferred is formaldehyde.

The polyvinyl phenols include, for example, homopolymers or copolymers of hydroxystyrenes such as o-hydroxystyrene, m-hydroxystyrene, p-hydroxystyrene, 2-(o-hydroxyphenyl)propylene, 2-(m-hydroxyphenyl)propylene, 2-(p-hydroxyphenyl)propylene, etc. These hydroxystyrenes may have, in the aromatic rings, substituent of halogen such as chlorine, bromine, iodine and fluorine or alkyl having from 1 to 4 carbon atoms. Accordingly, the polyvinyl phenols may have, in the aromatic rings, halogen or alkyl having from 1 to 4 carbon atoms.

The polyvinyl phenols may be obtained, in general, by polymerizing one or more optionally-substituted hydroxystyrenes in the presence of a radical-polymerization initiator or a cationic polymerization initiator. If desired, these polyvinyl phenols may be partially hydrogenated so as to lower the light absorbance of the resins. Also if desired, a part of the OH groups in the polyvinyl phenol may be protected by t-butoxycarbonyl, pyranyl, furanyl, etc. The polyvinyl phenols for use in the present invention have Mw of from 1,000 to 100,000, preferably from 1,500 to 50,000.

The polyvinyl phenols are more preferably those optionally having, in the aromatic rings, alkyl having from 1 to 4 carbon atoms. Especially preferred are unsubstituted polyvinyl phenol.

If the alkali-soluble resins have a molecular weight smaller than the above-mentioned ranges, the resist cannot form a satisfactory resist film; but if they have a molecular weight larger than the same, the solubility of the non-exposed area of the resist film in an alkaline developer will be small so that the formation of resist patterns is often impossible.

Of the above-mentioned alkali-soluble resins, especially preferred are the novolak resins.

The important characteristic feature of the present invention is to use a highly-alkylated alkoxymethylmelamine resin having a monomer content of from 5 to 40% by weight, as the crosslinking agent for the alkali soluble resins which acts on the resin under acidic conditions. As mentioned in Japanese Patent Application Laid-Open No. 3-75652, the increase in the purity of hexamethoxymethylmelamine (hereinafter referred to as HMMM) results in the decrease in the content of methylol compound. And the resist composition having the HMMM of improved purity as a crosslinking agent has improved storage stability. We found, however, even a trace amount of methylol compounds as impurities in the HMMM reduced the storage stability considerably and caused the decrease in the sensitivity. Although the mechanism for the decrease in the sensitivity is not fully clarified, we tentatively concluded that even the trace amount of the methylol compound can inhibit the catalytic process of crosslinking: in this type of resist the crosslinking process is catalyzed by the acid formed by irradiation. Therefore, in order to improve the stability of the resist composition during storage, it is necessary to obtain a nearly 100% pure HMMM not containing methylol compounds at all. However, the formulas of the methylol compounds are very similar to that of HMMM with an only exception that a part of the methoxymethyl group are replaced by methylol group. Consequently, the chemical properties are similar each other, and it is very difficult to remove completely the methylol compounds from HMMM.

We, the present inventors, have found that the content of the residual methylol compound was decreased during the polymerization of the monomer and the use of the resulting polymerization product as a crosslinking agent gave essentially no sensitivity decrease. Accordingly, it is the indispensable requirement for the present invention to use a highly-alkylated alkoxymethylmelamine resin having a monomer content of from 5 to 40% by weight as the crosslinking agent.

The alkoxymethylmelamine resin as referred to herein is a resin having a structure in which at least a part of the methylol group existing in a melamine resin (namely, a mixture comprising methylolmelamine monomers which are pre-condensates of melamine and formaldehyde, and low-condensates of melamine and formaldehyde to be formed by dehydrating condensation of methylolmelamines) have been alkylated and has Mw of approximately from 1,000 to 5,000, preferably approximately from 2,000 to 4,000 in terms of polystyrene. This has a degree of dispersion Mw/Mn (weight average molecular weight/number average molecular weight) of approximately from 2 to 10.

The highly-alkylated alkoxymethylmelamine resin as referred to herein is the alkoxymethylmelamine resin which have been highly alkylated. Preferably, the highly alkylated alkoxymethylmelamine resin of the present invention is the alkoxymethylmelamine resin in which 95% or more of the methylol group in the melamine resin as mentioned above has been alkylated. More precisely, it is such that 95% or more of the total methylol groups existing both in methylol melamine monomer and in the above mentioned low-condensates have been alkylated. In other words, it is such that 95% or more of the terminal hydroxyl groups on all the methylol groups derived from the methylolmelamine monomer structures have been replaced by alkoxy groups.

More precisely, the highly-alkylated alkoxymethylmelamine resin of the present invention is the alkoxymethylmelamine resin in which from 95% to 100% of the methylol group in the melamine resin has been alkylated.

The monomer components as referred to herein include monomers of methylolmelamines and alkoxymethylmelamines. The content of the monomer components in the alkoxymethylmelamine resin is from 5 to 40% by weight, preferably from 20 to 40% by weight. If the monomer components are more than 40% by weight, the stability of the resist containing the resin during storage is poor. On the other hand, alkoxymethylmelamine resin having a monomer content of less than 5% by weight need operation for removing monomers by high performance liquid chromatography and are therefore unsuitable for industrial use. In addition, such resins containing too small monomers are unfavorable, since the resist containing the resin will give a resist pattern having a reversed trapezoidal form as its cross section, when exposed to lights having a wavelength of 300 nm or less.

The monomer content may be determined by gel permeation chromatography.

It is preferred that the amount of the methylol groups remaining in the highly-alkylated alkoxymethylmelamine resin for use in the present invention or, that is, the proportion of the methylol groups to the total methylene groups therein that has been measured by $^{13}$C-NMR is less than 1 mol%, more preferably less than 0.5 mol%, most preferably 0%, in view of the stability of the resist composition during storage.

The highly-alkylated alkoxymethylmelamine resin having a monomer content of from 5 to 40% by weight may be produced in accordance with a known method of reacting a melamine with formaldehyde and an alcohol under an acidic condition (see Coloring Materials, Vol. 63, pp. 19–28, 1990). An excess amount of formaldehyde is added to the reaction system in order that the amino groups in the melamine may be completely methylolated, while these are reacted with an alcohol in such a way that 95% or more of the methylol groups are alkoxylated (alkylated) or, that is, 95% or more of the methylol groups are converted into alkoxymethyl groups. As the alcohol, preferably used is a lower alcohol having from 1 to 4 carbon atoms, such as methanol, ethanol, propyl alcohol, butanol, etc. During the methylolation and alkoxylation, poly-nucleating reaction (polymerizing reaction) occurs at the same time by which the degree of polymerization of the polymer formed is increased. The monomer components may be reduced by advancing the poly-nucleation or by additional purification of the polymer formed, for example, by distillation or re-precipitation. The content of the methylol groups in the thus-obtained high-alkylated melamine resin may be quantitatively determined by titration or by measuring the peak at 73 ppm in $^{13}$C-NMR.

When the highly-alkylated alkoxymethylmelamine resin having a monomer content of from 5 to 40% by weight of the present invention is used as the crosslinking agent to prepare a photo-resist, the sensitivity and the stability of the resulting photo-resist during storage are extremely good. The photo acid generating system to be combined with the resin is not specifically defined. Examples of the photo acid generating system are mentioned hereinafter. However, it is especially preferred to combine the resin and a photo acid generating system which is sensitive to i-line. This is because the pattern profiles of the resist to be obtained from the combination are much better than those of the resist to be obtained from the other combinations.

The photo acid generating system as referred to herein is a system of generating an acid when it is exposed to lights having a wavelength falling within the range of from 150 to 450 nm. It may be a photo acid generating agent alone or may also be composed of a photo acid generating agent and a sensitizing agent for elevating the sensitivity of the agent or for broadening the sensitive wavelength range for the same.

The photo acid generating agent includes, for example, organic halogen-containing compounds, onium salts, sulfonates, etc. For instance, mentioned are onium salts and sulfonates such as those disclosed by J. V. Crivello in Polymeric Materials Science and Engineering, Vol. 61, p. 63 (American Chemical Society), and photosensitive organic halogen-containing compounds such as those disclosed in Japanese Patent Examined Publication No. 54-23574.

More precisely, mentioned are compounds of the following formula (I):

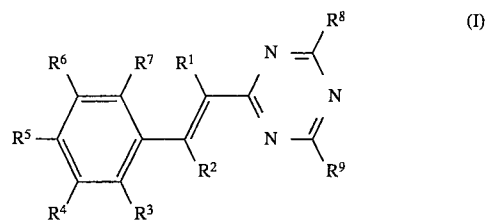

wherein $R^1$ and $R^2$ each represents a hydrogen or an alkyl; $R^3$, $R^4$, $R^5$, $R^6$ and $R^7$ each represents a hydrogen, an alkyl or an alkoxy; $R^8$ and $R^9$ each represents a hydrogen or a haloalkyl, provided that both $R^8$ and $R^9$ must not be hydrogen at the same time.

The alkyl for $R^1$ to $R^7$ includes, for example, methyl, ethyl and n-propyl. The alkoxy for $R^3$ to $R^7$ includes, for example, methoxy, ethoxy and n-propoxy. The haloalkyl for $R^8$ and $R^9$ includes, for example, alkyl substituted by chlorine, bromine and/or iodine. In general, the number of the carbon atoms in each of the alkyl, alkoxy and haloalkyl for $R^1$ to $R^9$ may be from 1 to 4 or so, preferably 1 or 2. Of the compounds of the above-mentioned formula (I), preferred are those where the haloalkyl of $R^8$ and $R^9$ each is a halomethyl such as trichloromethyl, tribromomethyl, dichloromethyl, dibromomethyl, monochloromethyl, monobromomethyl, triiodomethyl, diiodomethyl, monoiodomethyl, etc. Especially preferably, $R^8$ and $R^9$ in formula (I) are the same.

As other photo acid generating agents also usable in the present invention, mentioned are halogen-containing sulfolanes such as 3,4-dibromosulfolane, 3,4-dichlorosulforane, etc.; halogen-containing $C_{1-12}$ hydrocarbons, especially halogen-containing $C^{1-6}$ hydrocarbons, such as carbon tetrabromide, 1,2,3-tribromopropane, 1,2,3,4-tetrabromobutane, 1,1,2,2-tetrabromoethane, dibromo-tetrachloroethane, 1,6-dibromohexane, 1,4-dibromobutane, iodoform, hexabromocyclohexane, hexabromocyclododecane, etc.; halogen-containing sulfone compounds such as tribromomethylphenylsulfone, etc.; halogen-containing isocyanurate compounds such as tris(2,3-dibromopropyl) isocyanurate, etc.; halogen-containing alkylene glycol ether compounds such as methylene glycol bis (2,3-dibromopropyl) ether, etc.; halogen-containing triazines such as tris-(tribromomethyl)-s-triazine, tris( dibromomethyl )-s-triazine, tris(trichloromethyl)-s-triazine, tris(dichloromethyl)-s-triazine, etc.; halogen-containing ketones such as 1,1,3,3-tetrabromoacetone, hexachloroacetone, etc.; halogen-containing alcohols such as 2,3-dibromopropanol, etc.; as well as pentaerythritol tetrabromide, 1,3-dibromopropyne, 3,4,5-tribromosalicylanilide, diphenyliodonium salts, etc.

As the photo acid generating agent, also usable are photo-polymerization initiators such as those described in Japanese Patent Examined Publication No. 59-1281; S-triazines such as those described in Japanese Patent Examined Publication No. 57-1819; photosensitive compounds such as those described in Japanese Patent Publication No. 60-46700; and trihalomethyl compounds such as those described in Japanese Patent Application Laid-Open No. 63-261352.

The sensitizing agent to be combined with the photo acid generating agent is not specifically defined, provided that it has an activity of elevating the photosensitivity of the photo acid generating agent, especially that of organic halogen-containing compounds, or has an activity of broadening the sensitive wavelength range of lights to which the photo acid generating system is exposed whereby the photo acid generating agent is so sensitized as to generate an acid highly efficiently. However, preferred are aromatic amines as the sensitizing agent. More precisely, the sensitizing agent includes naphthylamines such as N-phenyl-1-naphthylamine, N,N-diphenyl-1-naphthylamine, N-phenyl-N-benzyl-1-naphthylamine, N-phenyl-N-styryl-1-naphthylamine, etc.; phenothiazines such as 10-methylphenothiazine, 2-trifluoromethylphenothiazine, 2-chlorophenothiazine, monobenzophenothiazine, dibenzophenothiazine, bis(phenothiazine), etc.; and phenoxazines. Especially preferred is at least one selected from the group consisting of N-phenyl-1naphthylamine, N,N-diphenyl-1-naphthylamine, N-phenyl-N-benzyl-1 -naphthylamine, N-phenyl-N-styryl-1-naphthylamine and phenothiazines. Above all, preferred is N-phenyl-1naphthylamine.

In the present invention, it is especially preferred that the photo acid generating system is sensitive to i-line. It is especially effective that the photo acid generating system is a photo acid generating agent sensitive to i-line or is a combination of a photo acid generating agent and a sensitizing agent in which the combination is sensitive to i-line. The photo acid generating system which is sensitive to i-line, as referred to herein, means such that the photo acid generating system has an extinction coefficient of 300 (liter/mol·cm) or more relative to lights having a wavelength falling within the range of from 350 to 450 nm. The above-mentioned molar extinction coefficient is preferably 500 (liter/mol·cm) or more.

The photo acid generating agent sensitive to i-line is not specifically defined, provided that it meets the above-mentioned requirements. As preferred examples of the agent, mentioned are the compounds of the above-mentioned formula (I).

On the other hand, the photo acid generating agent which becomes sensitive to i-line when combined with a sensitizing agent is at least one organic halogen-containing compound selected from the group consisting of halogen-containing sulfolanes, halogen-containing hydrocarbons, halogen-containing sulfone compounds, halogen-containing isocyanurate compounds, halogen-containing alkylene glycol ether compounds, halogen-containing triazines and halogen-containing ketones of the above-mentioned photo acid generating agents.

Of these, preferred are methylene glycol bis(2,3dibromopropyl) ether and tris(2,3-dibromopropyl) isocyanurate. Especially preferred is tris(2,3-dibromopropyl)isocyanurate.

In the present invention, the photo acid generating system which is sensitive to i-line is especially preferred, since the profile of the photo-resist pattern to be obtained by exposing the photo-resist of the present invention containing the photo acid generating system to i-line may have a rectangular or nearly rectangular form as its cross section.

In particular, the compounds of the above-mentioned formula (I) are especially preferably used as the photo acid generating agent in the present invention because of the following reasons: The photo-resist containing the compound is highly sensitive to not only far-ultraviolet rays having a wavelength of 300 nm or shorter but also g-line (436 nm) and i-line (365 nm) of high-pressure mercury lamps. The profile of the photo-resist pattern to be obtained by exposing the photo-resist containing the compound to i-line may be a rectangular or nearly rectangular form as its cross section. In addition, even though the resist film is made thick, a pattern having a high aspect ratio is obtained.

In the above-mentioned formula (I), $R^1$ and $R^2$ are especially preferably hydrogen. One to three of the substituents of $R^3$ to $R^7$ in formula (I) each is preferably alkyl or alkoxy having from 1 to 2 carbon atoms, especially preferably a methyl or methoxy. Of $R^3$ to $R^7$, those not being hydrogen are preferably the same. $R^8$ and $R^9$ in formula (I) are preferably the same, especially preferably trihalomethyl, more preferably trichloromethyl.

Specific examples of the compounds of formula (I) include those of the following formulae (i) to (vii). Of these, more effective are compounds of formulae (i) to (iii).

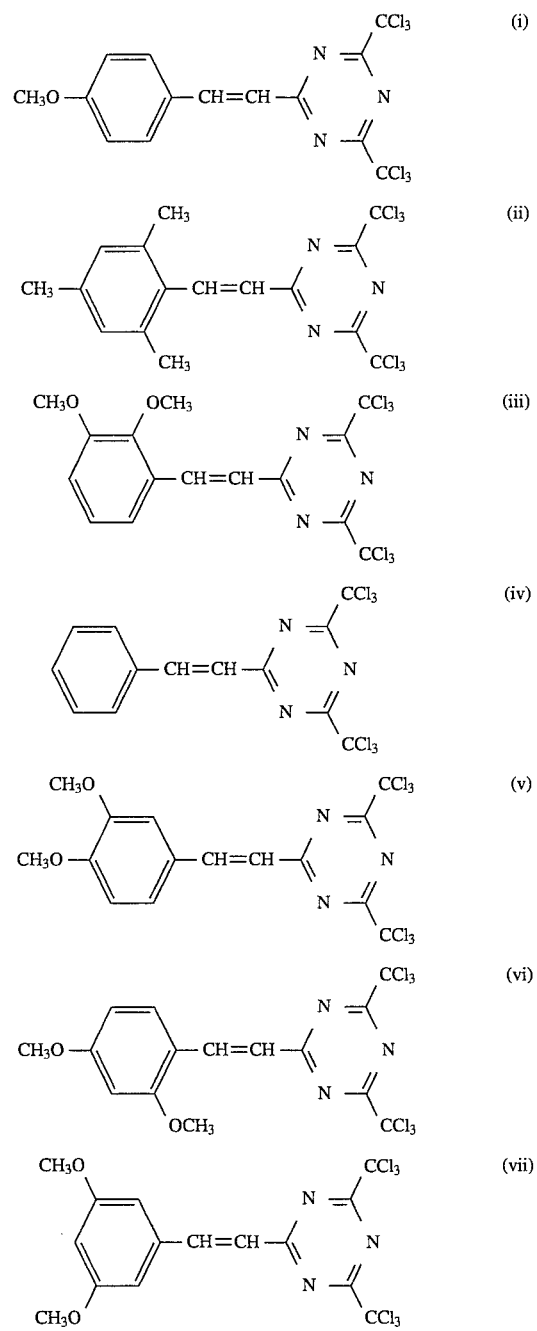

The photosensitive composition of the present invention contains the crosslinking agent generally in an amount of from 1 to 70 parts by weight, preferably from 5 to 50 parts by weight, and the photo acid generating system generally in an amount of from 0.005 to 30 parts by weight, preferably from 0.01 to 10 parts by weight, relative to 100 parts by weight of the alkali-soluble resin.

Where the photo acid generating system is composed of a photo acid generating agent and a sensitizing agent, the amount of the sensitizing agent to be added may be approximately from 0.1 to 30 parts by weight, preferably from 0.5 to 20 parts by weight, relative to 100 parts by weight of the alkali-soluble resin.

If the amount of the crosslinking agent in the composition is less than the above defined range, it cannot show a sufficient crosslinking effect so that the resist pattern to be formed will be poor. On the other hand, if it is more than the same, the coatability of the resist will be poor so that the resist is not suitable for practical use. If the amount of the photo acid generating system in the composition is less than the above defined range, the sensitivity of the resist is lowered so that the resist is not suitable for practical use. On the other hand, if it is more than the same, the transparency of the resist film will be lowered due to the presence of too much photo acid generating agent so that the profile of the resist pattern to be formed will be a reversed trapezoidal form as its cross section to often lower the resolving power of the resist film.

The negative photosensitive composition of the present invention is used, generally by dissolving the above-mentioned components in suitable solvents. The solvents are not specifically defined, provided that they may well dissolve the above-mentioned alkali-soluble resin, crosslinking agent, photo acid generating agent and sensitizing agent to give coating liquids having good coatability. As usable solvents, mentioned are cellosolve solvents such as methyl cellosolve, ethyl cellosolve, methyl cellosolve acetate, ethyl cellosolve acetate, etc.; propylene glycol solvents such as propylene glycol monomethyl ether, propylene glycol monoethyl ether, propylene glycol monobutyl ether, propylene gylcol monomethyl ether acetate, propylene glycol monoethyl ether acetate, propylene glycol monobutyl ether acetate, dipropylene glycol dimethyl ether, etc.; ester solvents such as butyl acetate, amyl acetate, ethyl butyrate, butyl butyrate, diethyl oxalate, ethyl pyruvate, ethyl 2-hydroxybutyrate, ethyl acetacetate, methyl lactate, ethyl lactate, methyl 3-methoxypropionate, etc.; alcohol solvents such as heptanol, hexanol, diacetone alcohol, furfuryl alcohol, etc.; ketone solvents such as cyclohexanone, methyl amyl ketone, etc.; high polar solvents such as dimethylformamide, dimethylacetamide, N-methylpyrrolidone, etc.; mixed solvents comprising them; mixtures of them and aromatic hydrocarbons, etc. The amount of the solvent to be used may be from 1 to 20 times by weight, relative to the total weight of the solid contents in the photosensitive composition.

The resist composition of the present invention may contain various additives, such as dyes, pigments, coating aids, development promoters, adhesiveness promoters, etc., only within the ranges not detracting from the properties of the composition.

Where resist patterns are formed on a semiconductor substrate, using the negative photosensitive composition of the present invention, the composition is generally dissolved in the above-mentioned solvent, coated on a semiconductor substrate in the manner mentioned hereinunder, exposed to lights so as to transfer a pattern thereon, heated (for post-exposure baking; PEB) and then developed. The semiconductor substrate may be anyone which is generally used for producing semiconductor devices, including, for example, a silicon substrate, a gallium arsenic substrate, etc.

A spin coater is generally used for coating the composition, and the thickness of the resist film to be formed is suitably from 0.5 μm to 10 μm or so but is not specifically limited. Where the resist film formed is relatively thick, a resist pattern having a high aspect ratio is obtained and this is useful for a resist in ion injection step.

The light sources for exposure are not specifically defined, but a light of 436 nm, 365 nm or 254 nm from mercury lamps or a light of 157 nm, 193 nm, 222 nm or 248 nm from excimer lasers is preferably used. The lights for exposure are not limited to monochromatic ones but may be broad ones. The exposure may also be conducted by phase-shift methods. In particular, exposure with lights of from 300 nm to 380 nm is preferred, and that with i-line (365 nm) is especially preferred.

The post-exposure baking (PEB) may be effected, generally using a hot plate, preferably at 70° to 140° C. for 15 seconds to 10 minutes or so. In place of a hot plate, a convection oven may also be used. The latter case generally needs a longer time than the case using a hot plate.

As the developer, preferably used is an aqueous alkaline developer containing an inorganic alkali such as potassium hydroxide, sodium hydroxide, sodium carbonate, potassium carbonate, sodium silicate, sodium metasilicate, aqueous ammonia, etc.; a primary amine such as ethylamine, n-propylamine, etc.; a secondary amine such as diethylamine, di-n-propylamine, etc.; tertiary amines such as triethylamine, trimethylamine, etc.; or a quaternary ammonium salt such as tetramethylammonium hydroxide, trimethylhydroxyethylammonium hydroxide, etc. The developer may optionally contain alcohols, surfactants, etc. The photoresist liquid and the developer are used, after they are filtered through a micro-filter so as to remove dust therefrom.

The negative photosensitive composition of the present invention may be used not only for production of ultra-LSI but also for production of ordinary IC, as well as for production of masks and for production of printing plates for lithography, intaglio printing or relief printing. It may also be used as a photo-resist or solder resist for producing printed circuit plates and be used as color filters for liquid crystal display devices. It is also usable for forming images such as relief images or duplicated images or is usable as a photo-curable ink, a coating paint, an adhesive, etc.

In particular, the negative photosensitive composition of the present invention is useful for a photo-resist for forming semiconductor circuits.

Since the negative photosensitive composition of the present invention has an excellent stability during storage and may form good pattern profiles. In addition, it has a high sensitivity and a high resolving power.

Using the negative photosensitive composition of the present invention, it is possible to form resist patterns having good pattern profiles and having high aspect ratios, even though the composition is coated thick to form a thick resist film.

Next, the present invention will be explained in more detail with reference to the following examples, by which the present invention is not whatsoever limited. Various changes and modifications of the illustrated embodiments of the invention can be made without departing from the spirit and scope of the invention.

To measure Mw of the methoxymethylmelamine resins used and the monomer content in the resins in the following examples and comparative examples, employed was GPC (HLC-8020, made by Tosoh Corp.) equipped with TSK GMHXL as the separation column. GPC was conducted, using tetrahydrofuran as the eluent, at a flow rate of one ml/min and at a temperature of 40° C. The monomer content was calculated from the ratio of the monomer peak area to the whole peak area in GPC.

The measurement of the degree of alkylation was effected in the manner mentioned below. Using an NMR device of JEOL GX-270 Model (made by Nippon Electronic Co.), $^{13}$C-NMR of the crosslinking agent was measured in a solvent of CDCl$_3$, and the integrated value of the methylene groups not contained in alkoxymethylene groups (including the integrated value of the methylene groups derived from dimethylolamino groups and monomethylolamino groups) and the integrated value of all methylene groups were obtained. The value obtained by subtracting the integrated value of the methylene groups not contained in alkoxymethylene groups from the integrated value of all methylene groups was divided by the integrated value of all methylene groups, and the resulting quotient was represented by percentage as the degree of alkylation.

The measurement of the content of the remaining methylol groups was effected in the same manner as in measurement of the degree of alkylation mentioned above. Precisely, the integrated value of the methylene groups derived from methylol groups and the integrated value of all methylene groups were obtained by $^{13}$C-NMR, and the quotient obtained by dividing the integrated value of the methylene groups derived from methylol groups by the integrated value of all methylene groups was represented by percentage as the content of the remaining methylol groups.

In the following examples, the extinction coefficient ($\epsilon$) and the maximum absorption wavelength ($\lambda$max) of the photo acid generating systems used were measured, using a spectrophotometer of U-3500 Model (made by Hitachi Ltd.) and using tetrahydrofuran as the solvent. $\epsilon$ hereinunder indicates the extinction coefficient at 365 nm.

EXAMPLES 1 TO 2, AND COMPARATIVE EXAMPLES 1 to 3

20 g of m-cresol/formaldehyde novolak resin (Mw=2,700), 1 g of tris(2,3-dibromopropyl) isocyanurate as the photo acid generating agent, 2 g of N-phenyl-1-naphthylamine as the sensitizing agent, and 3 g of a methoxymethylmelamine resin shown in Table 1 below as the crosslinking agent were dissolved in 60 g of methyl 3-methoxypropionate. The resultant solution was filtered through a 0.2 μm-filter to obtain a photo-resist liquid. The photo-resist liquids thus obtained were separately stored at room temperature and in a refrigerator at 5° C. each for 3 months.

Each photo-resist liquid thus stored for 3 months was coated on a silicon substrate (5×5 inches) with a spin coater and dried on a hot plate at 100° C. for 60 seconds. The resist film thus formed had a thickness of 1.32 μm. The resist films on the silicon substrates were exposed to i-line, using a reduction-projecting exposure device, while the time for exposure was varied. These were heated on a hot plate at 100° C. for 90 seconds for post-exposure baking, and then developed with an aqueous 2.38 % tetramethylammonium hydroxide solution at 23° C. for 60 seconds. After the development, the amount for exposure by which the resin had begun to be crosslinked to give the resist pattern on the silicon substrate (Eth) was obtained, and this was represented as the sensitivity of the resist.

The results obtained are shown in Table 1.

The width of the finest line that could be resolved by observation with a scanning electronic microscope was obtained with the result that the width of the finest line of the resists of Examples 1 and 2 (both stored in the refrigerator and at room temperature) that could be resolved by the observation was 0.4 μm. This demonstrates that the resists had a high resolving power.

The mixture (½, by weight) of tris(2,3-dibromopropyl) isocyanurate and N-phenyl-1-naphthylamine had $\epsilon$ of 4.27× 10$^3$ (liter/mol·cm) and $\lambda$max of 339 nm.

EXAMPLE 3

20 g of cresol/formaldehyde novolak resin (Mw=2,700), 0.5 g of the compound of the above-mentioned formula (i) as the photo acid generating agent, and 7 g of a methoxymethylmelamine resin shown in Table 1 as the crosslinking agent were dissolved in 60 g of methyl 3-methoxypropionate. The resultant solution was filtered through a 0.2 μm-filter to obtain a photo-resist liquid. This was evaluated in the same manner as in Example 1. The results obtained are shown in Table 1.

The compound of formula (i) had $\epsilon$ of 3.14×10$^4$ (liter/ mol·cm) and $\lambda$max of 377 nm.

EXAMPLE 4

The same process as in Example 3 was repeated, except that 20 g of m-cresol/p-cresol/2,5-xylenol/ resorcinol/formaldehyde novolak resin (m-cresol/p-cresol/ 2,5-xylenol/resorcinol=7/2/1/1, by mol; Mw=5,000) were used. The results obtained are shown in Table 1.

As shown in Table 1 below, the sensitivity of the resists of Comparative Examples 1 and 2, containing the melamine resin having a high monomer content, significantly varied, depending on the conditions for storing (at room temperature, while cooled). Precisely, the sensitivity of the resists stored at room temperature was lowered more than that of the resists stored while cooled. Thus, the storage stability of the resists of Comparative Examples 1 and 2 was poor. The sensitivity of the fresh resists (before stored) was almost the same as that of the resists stored for 3 months in the refrigerator.

In Comparative Example 3, the resist contained the crosslinking agent having a low degree of alkylation, though having a lowered monomer content. The sensitivity of this resist was low.

As opposed to these comparative resists, the sensitivity of the resists of the present invention of Examples 1 and 2, containing the crosslinking agent having a high degree of alkylation and a monomer content falling within the defined scope of the present invention, was kept almost constant, not depending on the conditions for storing. Thus, the storage stability of these resists of the present invention was extremely good.

As is also noted from Table 1, methylol groups were detected in the crosslinking agents in the resists of Comparative Examples 1 to 3 and these resists had a poor storage stability; while no methylol group was found in the crosslinking agents in the resists of Examples 1 to 4 of the present invention and these resists had a good storage stability.

TABLE 1

Properties and Storage Stability of Photo-resists

| | Novolak Resin (*1) | Photo Acid Generating System (*2) | Methoxymethylmelamine Resin | | | | | Sensitivity, Eth (msec) | | Property |
|---|---|---|---|---|---|---|---|---|---|---|
| | | | Mw | Mw/Mn | Degree of Alkylation (mol %) | Monomer Content (wt. %) | Content of Remaining Methylol Groups (mol %) | Stored at room temperature | Stored in refrigerator | |
| Example 1 | m | PNA + BrICN | 2950 | 4.3 | >95 | 34.9 | 0 | 50 | 50 | Not deteriorated |
| Example 2 | m | PNA + BrICN | 1900 | 3.0 | >95 | 36.7 | 0 | 80 | 60 | Not deteriorated |
| Example 3 | m | (i) | 2950 | 4.3 | >95 | 34.9 | 0 | 75 | 75 | Not deteriorated |
| Example 4 | m, p, x, r | (i) | 2950 | 4.3 | >95 | 34.9 | 0 | 80 | 80 | Not deteriorated |
| Comparative Example 1 | m | PNA + BrICN | 400 | 1.1 | >95 | 83.8 | 1 | 180 | 80 | Deteriorated |
| Comparative Example 2 | m | PNA + BrICN | 300 | 1.0 | >95 | 93.0 | 1.3 | 110 | 60 | Deteriorated |
| Comparative Example 3 | m | PNA + BrICN | 500 | 1.3 | more than 90 but less than 95 | 52.0 | 3.4 | 210 | 130 | Deteriorated |

(*1) Phenols constituting the novolak resins were as follows: m: m-cresol, p: p-cresol, x: 2,5-xylenol, r: resorcinol
(*2) Compounds constituting the photo acid generating systems were as follows: PNA: N-phenyl-1-naphthylamine, BrICN: tris(2,3-dibromopropyl) isocyanurate, (i): compound of formula (i)

EXAMPLE 5

10.00 g of m-cresol/formaldehyde novolak resin (Mw: 2,600), 1.5 g of methoxymethylmelamine resin (Mw=2,950; degree of alkylation >95 %; monomer content=34.9 wt.%) as the crosslinking agent, and 0.10 g of the compound of the above-mentioned formula (i) as the photo acid generating agent were dissolved in 13 g of methyl 3-methoxypropionate. The resultant solution was filtered through a 0.2 μm-filter to obtain a photo-resist liquid.

The photo-resist liquid thus obtained was coated on a silicon substrate with a spin coater and baked on a hot plate at 100° C. for 70 seconds to form thereon a resist film having a thickness of 5 μm. The resist film on the silicon substrate was exposed to i-line, using a reduction-projecting exposure device, and baked on a hot plate at 100° C. for 90 seconds. Next, the resist film was developed with an aqueous 2.38 % tetramethylammonium hydroxide solution for one minute. The resist pattern thus obtained was observed with a scanning electronic microscope to measure and evaluate the resolving power, the aspect ratio (height of resist pattern/ width of resist pattern), the pattern profile, the tapered angle and the sensitivity ($E_0$). $E_0$ represents the exposure time (i.e., exposure energy) which gives exactly the same dimension of line-and-space resist pattern as that of the mask used. The results obtained are shown in Table 2 below.

EXAMPLE 6

A photo-resist liquid was obtained in the same manner as in Example 5, except that the amount of the photo acid generating agent was varied to 0.05 g, and this was evaluated in the same manner as in Example 5. The results obtained are shown in Table 2.

EXAMPLES 7 AND 8

Photo-resist liquids were obtained in the same manner as in Example 5, except that the amount of the crosslinking agent was varied to 2.5 g (Example 7) and 3.5 g (Example 8), and these were evaluated in the same manner as in Example 5. The results obtained are shown in Table 2.

EXAMPLE 9

A photo-resist liquid was obtained in the same manner as in Example 5, except that 0.10 g of the compound of the above-mentioned formula (ii) was used as the photo acid generating agent, and this was evaluated in the same manner as in Example 5. The results obtained are shown in Table 2.

The compound of formula (ii) had $\epsilon$ of $2.02 \times 10^4$ (liter/mol·cm) and λmax of 354 nm.

EXAMPLE 10

A photo-resist liquid was obtained in the same manner as in Example 5, except that 0.10 g of the compound of the above-mentioned formula (iii) was used as the photo acid generating agent, and this was evaluated in the same manner as in Example 5. The results obtained are shown in Table 2.

The compound of formula (iii) had $\epsilon$ of $1.90 \times 10^4$ (liter/mol·cm) and λmax of 347 nm.

EXAMPLE 11

A photo-resist liquid was obtained in the same manner as in Example 5, except that 10.00 g of m-cresol/p-cresol/ formaldehyde novolak resin (Mw=2,600; m-cresol/p- cresol=8/2 by mol) was used as the novolak resin, and this was evaluated in the same manner as in Example 5. The results obtained are shown in Table 2.

EXAMPLE 12

A photo-resist liquid was obtained in the same manner as in Example 11, except that 0.10 g of the compound of the above-mentioned formula (ii) was used as the photo acid generating agent, and this was evaluated in the same manner as in Example 5. The results obtained are shown in Table 2.

EXAMPLE 13

A photo-resist liquid was obtained in the same manner as in Example 11, except that 0.10 g of the compound of the above-mentioned formula (iii) was used as the photo acid generating agent, and this was evaluated in the same manner as in Example 5. The results obtained are shown in Table 2.

EXAMPLE 14

10.0 g of polyvinyl phenol resin (Mw=2,500), 1.5 g of methoxymethylmelamine resin (Mw=2,950; degree of alkylation >95%; monomer content=34.9 wt.%) as the crosslinking agent, and 0.05 g of the compound of the above-mentioned formula (i) as the photo acid generating agent were dissolved in 13.0 g of methyl 3-methoxypropionate. This was filtered through a 0.2 μm-filter to obtain a photo-resist liquid. The photo-resist liquid thus obtained was evaluated in the same manner as in Example 5. The results obtained are shown in Table 2.

EXAMPLES 15 AND 16

Photo-resist liquids were obtained in the same manner as in Example 14, except that the amount of the methoxymethylmelamine resin was varied to 2.5 g (Example 15) and 3.5 g (Example 16), and these were evaluated in the same manner as in Example 5. The results obtained are shown in Table 2.

EXAMPLE 17

A photo-resist liquid was obtained in the same manner as in Example 14, except that the amount of the photo acid generating agent was varied to 0.10 g, and this was evaluated in the same manner as in Example 5. The results obtained are shown in Table 2.

EXAMPLE 18

A photo-resist liquid was obtained in the same manner as in Example 14, except that 0.10 g of the compound of the above-mentioned formula (ii) was used as the photo acid generating agent, and this was evaluated in the same manner as in Example 5. The results obtained are shown in Table 2.

EXAMPLE 19

A photo-resist liquid was obtained in the same manner as in Example 14, except that 0.10 g of the compound of the above-mentioned formula (iii) was used as the photo acid generating agent, and this was evaluated in the same manner as in Example 5. The results obtained are shown in Table 2.

EXAMPLE 20

10.0 g of m-cresol/formaldehyde novolak resin (Mw=2,600), 3.5 of methoxymethylmelamine resin (Mw=2,950; degree of alkylation >95%; monomer content=34.9 wt.%) as the crosslinking agent, and 0.10 g of the compound of the above-mentioned formula (i) as the photo acid generating agent were dissolved in 13.0 g of methyl 3-methoxypropionate. The resultant solution was filtered through a 0.2 μm-filter to obtain a photo-resist liquid. Using the photo-resist liquid thus obtained, a resist pattern was formed in the same manner as in Example 5 except that a resist film having a thickness of 1.0 μm was formed. The resist pattern thus formed was evaluated in the same manner as in Example 5, using a scanning electronic microscope. The results obtained are shown in Table 2.

EXAMPLE 21

A photo-resist liquid was obtained in the same manner as in Example 20, except that the amount of the methoxymethylmelamine resin was varied to 1.5 g, and this was evaluated in the same manner as in Example 5. The results obtained are shown in Table 2.

COMPARATIVE EXAMPLE 4

10.0 g of m-cresol/formaldehyde novolak resin (Mw=2,600), 3.5 of methoxymethylmelamine resin (Mw=300; degree of alkylation >95 %; monomer content=93.0 wt.%) as the crosslinking agent, and 0.10 g of tris(trichloromethyl)-s-triazine as the photo acid generating agent were dissolved in 13.0 g of methyl 3-methoxypropionate. The resultant solution was filtered through a 0.2 μm-filter to obtain a photo-resist liquid. The photo-resist liquid thus obtained was evaluated in the same manner as in Example 5. However, this was quite insensitive to i-line that had been applied thereto for exposure and gave no pattern.

TABLE 2

|  | Thickness of Resist Film (μm) | Sensitivity, $E_0$ (msec) | Resolution (μm) | Aspect Ratio | Pattern Profile (as cross section) | Tapered Angle |
| --- | --- | --- | --- | --- | --- | --- |
| Example 5 | 5.0 | 100 | 1.5 | 3.3 | rectangular | 92° |
| Example 6 | 5.0 | 130 | 1.5 | 3.3 | rectangular | 92° |
| Example 7 | 5.0 | 170 | 1.5 | 3.3 | rectangular | 91° |
| Example 8 | 5.0 | 180 | 1.5 | 3.3 | rectangular | 91° |
| Example 9 | 5.0 | 180 | 1.5 | 3.3 | rectangular | 91° |
| Example 10 | 5.0 | 280 | 1.5 | 3.3 | rectangular | 91° |
| Example 11 | 5.0 | 170 | 1.5 | 3.3 | slightly reversed trapezoidal | 94° |
| Example 12 | 5.0 | 210 | 1.5 | 3.3 | slightly reversed | 94° |

TABLE 2-continued

| | Thickness of Resist Film (μm) | Sensitivity, $E_0$ (msec) | Resolution (μm) | Aspect Ratio | Pattern Profile (as cross section) | Tapered Angle |
|---|---|---|---|---|---|---|
| Example 13 | 5.0 | 240 | 1.5 | 3.3 | trapezoidal slightly reversed trapezoidal | 94° |
| Example 14 | 5.0 | 70 | 1.5 | 3.3 | slightly trapezoidal | 87° |
| Example 15 | 5.0 | 80 | 1.5 | 3.3 | slightly trapezoidal | 87° |
| Example 16 | 5.0 | 80 | 1.5 | 3.3 | slightly trapezoidal | 87° |
| Example 17 | 5.0 | 70 | 1.5 | 3.3 | slightly trapezoidal | 87° |
| Example 18 | 5.0 | 80 | 1.5 | 3.3 | slightly trapezoidal | 87° |
| Example 19 | 5.0 | 80 | 1.5 | 3.3 | slightly trapezoidal | 87° |
| Example 20 | 1.0 | 40 | 0.5 | 2.0 | slightly trapezoidal | 86° |
| Example 21 | 1.0 | 40 | 0.5 | 2.0 | slightly trapezoidal | 87° |
| Comparative Example 4 | 5.0 | | Not resolved | | | 90° |

EXAMPLES 22 AND 23

Each of the photo-resist solution prepared in Examples 1 and 2 was separately coated on silicon substrates (5×5 inches) each with a spin coater and dried on a hot plate at 100° C. for 60 seconds. The thickness of the each resist films formed was 1.23 μm.

The resist films formed on the silicon substrates each were exposed, heated for post-exposure baking and developed in the same manner as in Example 1 to obtain resist patterns. The patterns thus obtained each were observed with a scanning electronic microscope to measure and evaluate the resolving power, the aspect ratio, the pattern profile and the tapered angle. In the patterning experiments, the exposure time which gives exactly the same dimension of line-and-space resist pattern as that of the mask used was determined (sensitivity $E_0$).

TABLE 3

| | Thickness of Resist Film (μm) | Sensitivity, $E_0$ (msec) | Resolution (μm) | Aspect Ratio | Pattern Profile (as cross section) | Tapered Angle |
|---|---|---|---|---|---|---|
| Example 22 (*1) | 1.23 | 280 | 0.36 | 3.4 | slightly trapezoidal | 86° |
| Example 23 (*2) | 1.23 | 530 | 0.36 | 3.4 | slightly trapezoidal | 86° |

(*1): Photo-resist of Example 1 was used.
(*2): Photo-resist of Example 2 was used.

While the invention has been described in detail and with reference to specific embodiments thereof, it will be apparent to one skilled in the art that various changes and modifications can be made therein without departing from the spirit and scope thereof.

What is claimed is:

1. A negative photosensitive composition comprising an alkali-soluble resin selected from the group consisting of a novolak resin having a weight average molecular weight of from 1,000 to15,000 and a polyvinylphenol having a weight average molecular weight of from 1,000 to 100,000, a photo acid generating system, and a crosslinking agent for the alkali-soluble resin which acts on the resin under acidic conditions, wherein the photo acid generating system is present in an amount of from 0.005 to 30 parts by weight relative to 100 parts by weight of the alkali-soluble resin, and the crosslinking agent is present in an amount of from 1 to 70 parts by weight relative to 100 parts by weight of the alkali-soluble resin; which is characterized in that the crosslinking agent is a highly-alkylated alkoxymethylmelamine resin having a monomer content of from 5 to 40% by weight, and the highly-alkylated alkoxymethylmelamine resin is such that 95% or more of the methylol groups in the melamine resin have been alkylated.

2. The negative photosensitive composition as claimed in claim 1, in which the highly-alkylated alkoxymethylmelamine resin has a monomer content of from 20 to 40% by weight.

3. The negative photosensitive composition as claimed in claim 1, in which the highly-alkylated alkoxymethylmelamine resin has a weight average molecular weight of from 1,000 to 5,000 in terms of polystyrene.

4. The negative photosensitive composition as claimed in claim 1, in which the highly-alkylated alkoxymethylmelamine resin is such that the proportion of the methylol groups therein to all the methylene groups therein is less than 1 mol%.

5. The negative photosensitive composition as claimed in claim 1, in which the alkali-soluble resin is a novolak resin is prepared by condensing at least one phenol selected from the group consisting of o-cresol, m-cresol, p-cresol, 2,5-xylenol, 3,5-xylenol and resorcinol with aldehyde(s).

6. The negative photosensitive composition as claimed in claim 5, in which the phenols are composed of m-cresol/p-cresol/2,5-xylenol/3,5-xylenol/resorcinol at a molar ratio of (70 to 100)/(0 to 30)/(0 to 20)/(0 to 20)/(0 to 20).

7. The negative photosensitive composition as claimed in claim 1, in which the polyvinylphenol is optionally subsitituted by $C_{1-4}$ alkyl in the aromatic rings.

8. The negative photosensitive composition as claimed in claim 1, in which the photo acid generating system is a photo acid generating agent itself or a combination of a photo acid generating agent and a sensitizing agent.

9. The negative photosensitive composition as claimed in claim 8, which contains the sensitizing agent in an amount of from 0.1 to 30 parts by weight relative to 100 parts by weight of the alkali-soluble resin.

10. The negative photosensitive composition as claimed in claim 1, in which the photo acid generating system is sensitive to i-line radiation of a mercury-vapor lamp.

11. The negative photosensitive composition as claimed in claim 1, in which the photo acid generating system is a photo acid generating agent of a formula (I):

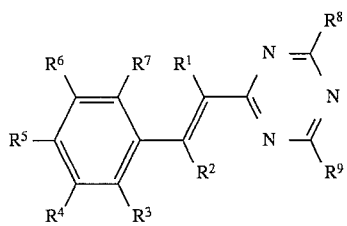

wherein $R^1$ and $R^2$ each represents a hydrogen or an alkyl; $R^3$, $R^4$, $R^5$, $R^6$ and $R^7$ each represents a hydrogen, an alkyl or an alkoxy;
$R^8$ and $R^9$ each represents a hydrogen or a haloalkyl, provided that both $R^8$ and $R^9$ must not be hydrogen at the same time.

12. The negative photosensitive composition as claimed in claim 11, in which $R^8$ and $R^9$ in formula (I) are the same and are halomethyl.

13. The negative photosensitive composition as claimed in claim 11, in which $R^1$ and $R^2$ in formula (I) are hydrogen.

14. The negative photosensitive composition as claimed in claim 11, in which one to three of the substituents $R^3$ to $R^7$ in formula (I) each is a $C_{1-2}$ alkyl or $C_{1-2}$ alkoxy.

15. The negative photosensitive composition as claimed in claim 1, in which the photo acid generating system is a combination of at least one organic halogen-containing compound selected from the group consisting of halogen-containing sulfolanes, halogen-containing hydrocarbons, halogen-containing sulfone compounds, halogen-containing isocyanurate compounds, halogen-containing alkylene glycol ether compounds, halogen-containing triazines and halogen-containing ketones, and a sensitizing agent.

16. The negative photosensitive composition as claimed in claim 15, in which the organic halogen-containing compound is methylene glycol bis(2,3-dibromopropyl) ether or tris(2,3-dibromopropyl) isocyanurate.

17. The negative photosensitive composition as claimed in claim 15, in which the sensitizing agent is at least one selected from the group consisting of naphthylamines, phenothiazines and phenoxazines.

18. The negative photosensitive composition as claimed in claim 15, in which the sensitizing agent is at least one selected from the group consisting of N-phenyl-1-naphthylamine, N,N-diphenyl-1-naphthylamine, N-phenyl-N-benzyl-1-naphthylamine, N-phenyl-N-styryl-1-naphthylamine and phenothiazine.

19. The negative photosensitive composition as claimed in claim 15, in which the sensitizing agent is N-phenyl-1-naphthylamine.

20. A method for forming a negative photo-resist pattern comprising a step of coating a negative photo-sensitive composition comprising an alkali-soluble resin selected from the group consisting of a novolak resin having a weight average molecular weight of from 1,000 to 15,000 and a polyvinylphenol having a weight average molecular weight of from 1,000 to 100,000, a photo acid generating system, and a crosslinking agent for the alkali-soluble resin which acts on the resin under acidic conditions, wherein the photo acid generating system is present in an amount of from 0.005 to 30 parts by weight relative to 100 parts by weight of the alkali-soluble resin, and the crosslinking agent is present in an amount of from 1 to 70 parts by weight relative to 100 parts by weight of the alkali-soluble resin, in which the crosslinking agent is a highly-alkylated alkoxymethylmelamine resin having a monomer content of from 5 to 40% by weight and the high-alkylated alkoxymethylmelamine resin is such that 95% or more of the methylol groups in the melamine resin have been alkylated, on a semiconductor substrate, a step of transferring a pattern by exposing the coated photosensitive composition to light, a step of heating the pattern-transferred photosensitive composition, and a step of developing the pattern.

21. The method for forming a negative photo-resist pattern as claimed in claim 20, in which the exposure is conducted with i-line radiation of a mercury-vapor lamp.

* * * * *